(12) United States Patent
Yasuda et al.

(10) Patent No.: US 6,596,186 B2
(45) Date of Patent: Jul. 22, 2003

(54) MASK FOR THE SELECTIVE GROWTH OF A SOLID, A MANUFACTURING METHOD FOR THE MASK, AND A METHOD FOR SELECTIVELY GROWING A SOLID USING THE MASK

(75) Inventors: Tetsuji Yasuda, Ibaraki (JP); Kazuyuki Ikuta, Ibaraki (JP); Satoshi Yamasaki, Ibaraki (JP); Kazunobu Tanaka, Ibaraki (JP); Doo-sup Hwang, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/917,711

(22) Filed: Jul. 31, 2001

(65) Prior Publication Data

US 2002/0028322 A1 Mar. 7, 2002

Related U.S. Application Data

(62) Division of application No. 09/263,223, filed on Mar. 5, 1999, now Pat. No. 6,287,699.

(51) Int. Cl.[7] ............................ B44C 1/22; H01L 21/00
(52) U.S. Cl. .......................... 216/41; 216/49; 438/725
(58) Field of Search .................. 438/706, 723, 438/745, 756, 725; 216/41

(56) References Cited

U.S. PATENT DOCUMENTS

| | | | |
|---|---|---|---|
| 3,715,245 A | 2/1973 | Barnett et al. | |
| 4,043,848 A | 8/1977 | Bazin | |
| 4,343,878 A | 8/1982 | Chiang | |
| 5,363,793 A | * 11/1994 | Sato | ................... 117/2 |
| 5,504,021 A | * 4/1996 | Hong et al. | ................ 437/42 |
| 5,550,773 A | * 8/1996 | Woerlee et al. | ........ 365/185.23 |
| 5,693,979 A | 12/1997 | Sato | |
| 5,982,023 A | 11/1999 | Matsushita et al. | |
| 6,013,399 A | 1/2000 | Nguyen | |
| 6,020,269 A | * 2/2000 | Wang et al. | ................ 438/717 |
| 6,137,120 A | 10/2000 | Shindo et al. | |

FOREIGN PATENT DOCUMENTS

| | | |
|---|---|---|
| JP | 63-67745 | 3/1983 |
| JP | 61-174737 | 8/1986 |
| JP | 2-105441 | 4/1990 |
| JP | 2-181969 | 7/1990 |

* cited by examiner

Primary Examiner—William A. Powell
(74) Attorney, Agent, or Firm—Volentine Francos, PLLC

(57) ABSTRACT

A mask for a selective growth of a solid, is provided in which the solid is selectively grown in a predetermined region of a substrate and growth on other regions is suppressed. A method is also provided for selectively growing a solid on only the predetermined region of a substrate using the mask. In the mask, a surface layer and an underlayer are provided, each having different chemical compositions. Thus, even if the mask is formed on a substrate in an ultra thin film, the generation of mask defects can be suppressed and stability provided to heat and electron beams.

15 Claims, 6 Drawing Sheets

MASK FOR THE SELECTIVE GROWTH OF A SOLID, A MANUFACTURING METHOD FOR THE MASK, AND A METHOD FOR SELECTIVELY GROWING A SOLID USING THE MASK

CROSS REFERENCE TO RELATED APPLICATIONS

This is a divisional application of application Ser. No. 09/263,223, filed Mar. 5, 1999, now U.S. Pat. No. 6,287,699, which is hereby incorporated by reference in its entirety for all purposes.

This application relies for priority upon Japanese Patent Application No. 10-71265, filed on Mar. 6, 1998, the contents of which are herein incorporated by reference in their entirety.

BACKGROUND OF THE INVENTION

The present invention relates to a mask that may be used for selectively growing a solid over a substrate during the manufacture of a semiconductor device. The mask defines a region in which the solid is to be grown. The present invention also relates to a manufacturing method of such a mask, and a method for selectively growing a solid using the mask.

Selective growth of a solid is a common technology required during the manufacture of a semiconductor device, in which silicon (Si) or gallium arsenide (GaAs) is selectively grown on a defined region of a semiconductor substrate. Currently, a semiconductor such as Si or GaAs, a metal such as tungsten (W) or aluminum (Al); and a silicide compound have been used as a material for a thin film, which is capable of being grown selectively.

During a selective growth process, the surface of the substrate is covered with a mask so as to suppress the growth of a solid on an undefined region covered by the mask. The material for the mask is determined by taking into consideration the types of substrate and solid material to be grown. Typical materials for a mask includes silicon dioxide which is obtained through the thermal oxidation of silicon or a vapor deposition method, and silicon nitride, which is formed by the vapor deposition method. In general, the thickness of a mask is several tens of nanometers (nm) or more. Also, the region in which a solid is to be selectively grown is defined by depositing a photoresist over the mask and then patterning the mask by photolithography.

However, as semiconductor devices become smaller, a technology for reducing the size of the selective growth region from units of submicrons into units of nanometers is required together with an ultra thin mask for use in this process, having a thickness of several nanometers or less, e.g., below 10 nm. Also, as the thickness of the mask is reduced, a mask material with both reaction selectivity and stability is required. However, such thin film cannot be formed of a single chemical composition.

The above problem will be explained using a thin mask formed of silicon dioxide by way of example. Firstly, if the mask is thin, the mask will be susceptible to defects such as fine voids or holes, so that the selectivity will be deteriorated. Therefore, it is favorable to form such an ultra thin mask at a lower temperature than a conventional method so as to precisely control the thickness of the thin mask. However, these low temperature conditions can easily cause other defects in the mask. In order to reduce the density of defects in the mask, a high-temperature annealing is favorable. However, a silicon dioxide film with a thickness of several nanometers or less, e.g., below 10 nm, is thermally unstable on the silicon substrate. As a result, the silicon dioxide film decomposes and desorbs during any annealing step performed at approximately 800° C. or more. Thus, it is not possible to anneal the silicon dioxide film at a high temperature.

A second problem occurs when the mask is used as an insulating layer in a final device. By using the phenomenon of a desorption of oxygen by irradiating electron beams onto the silicon dioxide film, a fine pattern having a thickness of several nanometers, e.g., below 10 nm, can be formed directly by irradiating electron beams onto the mask without using a resist. However, it is necessary to limit the desorption of oxygen from the mask within the surface layer, which is caused by the irradiation of electron beams, so as to use the mask as an insulating layer later. However, the general electron beams, which have an energy of 10 keV, because of their long free path of 10 nm or more within the solid, pass over the entire silicon dioxide with a thickness of several nanometers. In other words, the mask layer formed of only silicon dioxide cannot be used as an insulating layer if oxygen is desorbed from it by irradiating the electron beams.

SUMMARY OF THE INVENTION

To solve the above problems, it is an object of the present invention to provide a mask to be used for selectively growing a solid. It is also an object of the present invention to provide a manufacturing method for such a mask, in which the mask is formed out of an ultra thin film, the generation of defects is suppressed, and stability to both heat and further irradiation by electron beams is provided.

It is another object of the present invention to provide a method for selectively growing a solid on a substrate using this mask for the selective growth of a solid.

According to an aspect of the first object, there is provided a mask for allowing selective growth of a solid over a growth region of a substrate and suppressing growth of the solid over other regions of the substrate. This mask includes an underlayer formed over the substrate, and a surface layer formed over the underlayer, wherein the surface layer and the underlayer have different chemical compositions.

Preferably, the surface layer of the mask comprises silicon dioxide as its main component and the underlayer comprises silicon nitride as its main component. A portion of the surface layer over the growth region is preferably etched away. In addition, a portion of the underlayer over the growth region may also be etched away. The combined thickness of the underlayer and the surface layer is preferably 10 nanometers or less.

According to another aspect of the first object, there is provided a method for manufacturing a mask for selectively growing a solid over a growth region of a substrate and suppressing growth of the solid over other regions of the substrate. This method comprises: forming an underlayer comprising silicon nitride over the substrate, and forming a surface layer comprising silicon dioxide over the underlayer. Preferably, the combined thickness of the underlayer and the surface layer is 30 nanometers or less.

Also, there is provided a method for manufacturing a mask for selectively growing a solid over a growth region of a substrate and suppressing growth of the solid over other regions of the substrate. This method comprises: forming a surface layer comprising silicon dioxide over the substrate, and nitrifying the substrate underneath the surface layer. Preferably, the thickness of the surface layer is 10 nanometers or less.

To achieve the second object, there is provided a method for selective growth of a solid, comprising: forming a mask over a substrate for the selective growth of the solid, the mask comprising an underlayer and a surface layer, each of which has a different chemical composition, defining a selective growth region over the substrate, where the solid is to be grown, and selectively growing the solid in the selective growth region.

The underlayer preferably comprises silicon nitride and the surface layer preferably comprises silicon dioxide. The solid to be grown may comprise silicon, or it may comprise one of tungsten (W), aluminum (Al), or a silicide compound.

The step of defining the selective growth region may further comprise irradiating electron beams onto a portion of the surface layer over the growth region. The step of defining the selective growth region may further comprise: forming a photoresist pattern that exposes the selective growth region over the surface layer, and etching the surface layer using the photoresist pattern as an etching mask. The step of defining the selective growth region may even further comprise etching the exposed underlayer to expose the substrate, using the photoresist pattern as an etching mask.

The solid is preferably grown by one of a thermal CVD or a plasma CVD process, and the combined thickness of the underlayer and the surface layer is preferably 10 nanometers or less.

The present invention is obtained taking into consideration that the location of the growth region is determined by the surface layer of the mask and that the stability of the mask or the presence of defects such as voids are determined by the underlayer of the mask. In other words, a material with the optimal selectivity in growth is used for the surface layer and a material capable of improving the stability of the entire mask is used for the underlayer.

The mask for the selective growth of a solid is preferably in the form of a thin film over the surface of the substrate and preferably has at least a dual-layered structure. Any material that is capable of suppressing growth on the mask during the selective growth reaction of the solid may be used for the surface layer. The underlayer may be formed of any material that is stable to heat and excitation by electron beams or plasma, and that suppresses the structural defects, that has a good interfacial property or adhesiveness to the substrate. In other words, the underlayer may be formed out of a material that is capable of satisfying all the conditions required for the mask during the desired selective growth reaction.

Among the possible combinations of materials, a mask may be formed with a structure in which a silicon dioxide layer is formed over a silicon nitride layer. This mask can be widely applied for the selective growth.

With the surface layer formed of silicon dioxide, a silicon nitride underlayer is interposed between the substrate and the silicon dioxide surface layer. As a result, the problems of defective structure and weak stability to heat and electron beams resulting from a thinning of the mask can be eliminated.

Firstly, with regard to the defective structure, a combination of different materials, e.g., silicon nitride and silicon dioxide, and can suppress the generation of structural defects such as voids.

The thermal instability in the mask made of silicon dioxide only is caused by a decomposition between silicon as a substrate and the surface of the silicon dioxide layer. However, a decomposition does not occur between silicon and silicon nitride at a high temperature of 1000° C. or more. Thus, the dual-layered structure having a silicon nitride underlayer beneath a silicon dioxide surface layer is thermally stable.

The problem of the weak stability to electron beams is solved by using silicon nitride with a chemical composition that has a strong stability to the electron beams irradiation. Also, the chemical properties of silicon dioxide forming a thin surface layer is substantially the same as those of silicon dioxide in the form of a general thick film or of a bulk type. Thus, silicon dioxide serving as a mask can suppress the growth of various solid materials thereon and a growth region can be defined in it by irradiating electron beams.

A mask with a surface layer formed of silicon dioxide and a silicon nitride underlayer interposed between the substrate and the surface layer of silicon dioxide can be manufactured by two methods. In a first method, the silicon nitride firm is formed preferentially. The silicon nitride layer is formed by a vapor deposition method or through nitrification of a substrate if a silicon is used as the substrate. Here, the thickness and the chemical composition of the silicon nitride layer are determined in consideration of the desired selective growth reaction or whether to use the mask in the final structure of the device such as an insulating layer, by controlling the conditions for vapor deposition or nitrification. The silicon dioxide layer formed on the silicon nitride layer is formed to be thicker than a single atomic layer by a vapor deposition method or by oxidizing the silicon nitride layer.

In a second method, the silicon dioxide layer is formed prior to the silicon nitride layer. In this case, the substrate is limited to a silicon substrate, and the silicon nitride layer is formed through nitrification between activated nitrogen that has been diffused through the silicon dioxide layer into the solid and the silicon of the substrate. In detail, the silicon dioxide layer is initially formed by the vapor deposition method or through oxidation of the silicon substrate, to a thickness which is as thin as 10 nm or less such that nitrogen can be supplied through the silicon dioxide layer. Here, exciting a nitrogen atmosphere by plasma facilitates the nitrification.

The effect of the mask with silicon dioxide and silicon nitride layers on the selective growth of a solid was certified by two selective growth methods including a thermal chemical vapor deposition (CVD) method using a silicon hydride gas and a plasma-excited CVD method using a silicon hydride gas and a hydrogen gas and periodically modulates the flowing amount of the silicon hydride gas for the growth.

Also, in the mask structure with the silicon dioxide and silicon nitride layers, it is possible to define a selective growth region by irradiating electron beams onto the surface layer of silicon dioxide. That the silicon nitride layer is stable to the irradiation of electron beams were verified by irradiating electron beams with a 15~25 keV energy up to 400C/cm$^2$. In addition, the mask structure barely changed in the chemical composition after the annealing at 1000° C. for 30 seconds, which shows stability at a high temperature.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

In a preferred embodiment, of the present invention, a mask is formed of silicon dioxide and silicon nitride over a silicon substrate. The mask is used for a selective growth of a solid, and the effect of this mask has been evaluated by experimentation.

Figure 1:
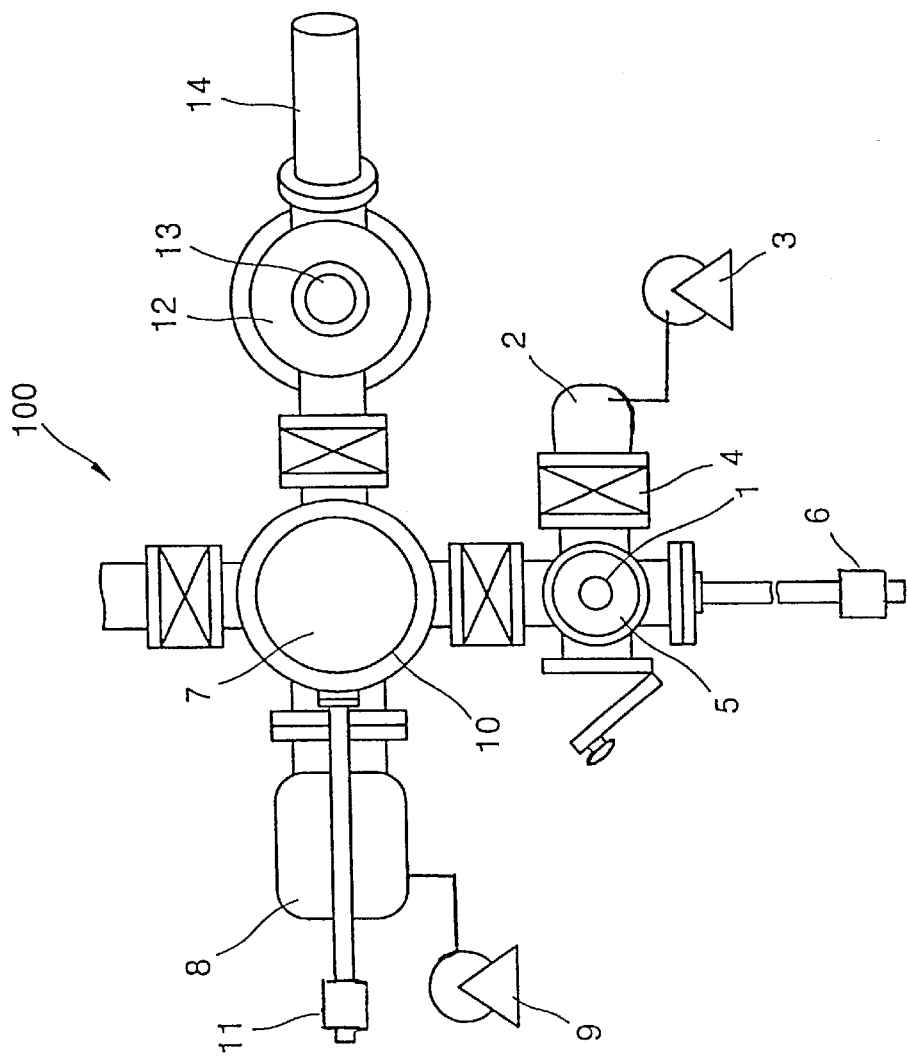
FIG. 1 is a diagram of a mask manufacturing and testing apparatus used in a preferred embodiment of the present invention.

Referring to FIG. 1, a mask manufacturing and testing apparatus 100 according to a preferred embodiment of the present invention comprises a mask forming chamber 1, a selective growing chamber 7, an electron-beam irradiating and testing chamber 12, and first and second carrying rods 6 and 11.

In the preferred embodiment, the mask forming chamber 1, comprises a turbo molecule pump 2 for creating a vacuum and exhausting plasma gases, a scroll pump 3, a pressure control valve 4 for controlling the pressure of the plasma gas, and a gas-supply pipe line 5 for supplying oxygen and nitrogen plasma gas. The mask preferably is formed in the mask forming chamber 1 through plasma oxidation and nitrification a silicon substrate.

The selective growth chamber 7 preferably comprises a turbo molecule pump 8 for creating a vacuum and exhausting reaction gases, a rotary pump 9, and a reaction gas supply pipe line 10. Silicon is selectively grown by chemical vapor deposition (CVD) in the selective growth chamber so as to test the mask. In the selective growth chamber 7, a thermal CVD method and a plasma-excited CVD method can both be used for the selective growth.

The electron beam irradiating and testing chamber preferably 12 comprises an electron beam generator 13 and an Auger electro-analyzer 14. The electron beam generator 13 generates electron beams to define a growth region in the mask and checks the stability of the mask with respect to the electron beams. The Auger electro-analyzer 14 analyzes the chemical composition at the surface of the mask.

A process for manufacturing a mask according to the preferred embodiment of the present invention using the mask manufacturing and testing apparatus 100 of FIG. 1 will now be described.

First, the surface of a silicon substrate is wet-etched in a hydrogen fluoride (HF) solution to create hydrogenate silicon and the resulting substrate is put into the mask manufacturing and testing apparatus 100. The surface of the hydrogen-terminated silicon is then exposed to plasma-excited nitrogen at room temperature, to form a silicon nitride underlayer. Here, the plasma generating conditions are preferably: 20% nitrogen gas (diluted with helium (He)), 300 mTorr gas pressure, 0.5 W radio wave power, and a processing time of 300 seconds. In the preferred embodiment, a parallel flat electrode is used for generating the plasma but a remote plasma type may also be used.

A silicon dioxide surface layer is then formed over the silicon nitride underlayer. The silicon dioxide surface layer is preferably formed by oxidizing the surface of the silicon nitride layer with plasma-excited oxygen at room temperature. The plasma generating conditions are preferably: 0.02% oxygen gas (diluted with He), 300 mTorr gas pressure, 0.5 W radio wave power, and a processing time of 20 seconds.

The resulting substrate, including the underlayer and the surface layer may then be moved through carrying rods 6 and 11 into the Auger electro-analyzer 14, where the change in chemical composition may be checked by Auger electro-spectroscopy.

Figure 2:
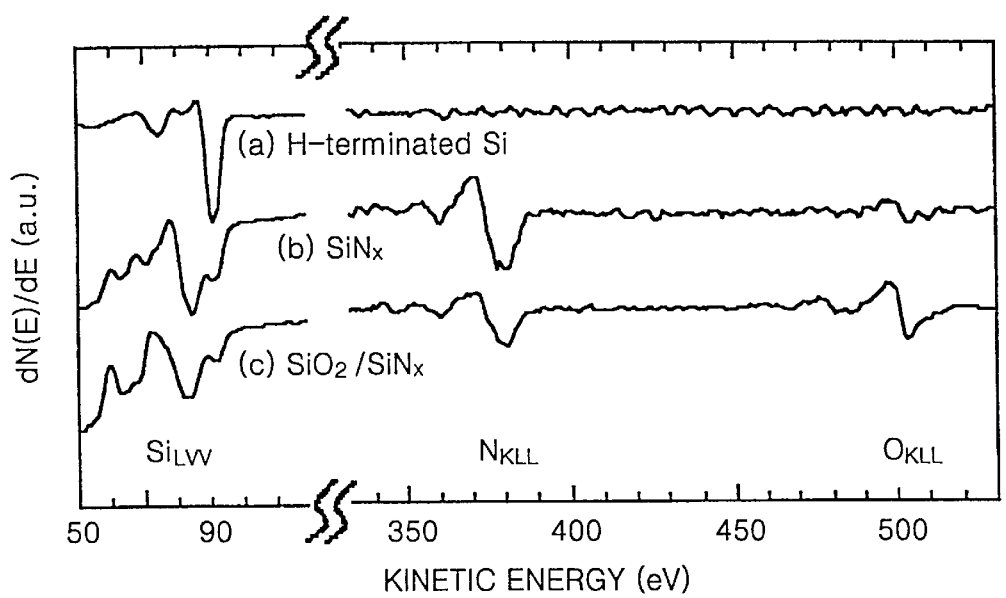
FIG. 2 is a graph showing a change in the chemical composition of a mask according to a preferred embodiment of the present invention, which was scanned by Auger electro-spectroscopy.

FIG. 2 shows the change in chemical composition of the mask according to the preferred embodiment of the present invention. This change in chemical composition was checked through a scanning by Auger electro-spectroscopy. In FIG. 2, LVV peaks of silicon ($Si_{LVV}$) and KLL peaks of nitrogen ($N_{KLL}$) and oxygen ($O_{KLL}$) are shown. The surface of the hydrogen-terminated silicon (a) was nitrified to form a silicon nitride layer (b) with a thickness of approximately 1nm, and then oxidized to form a silicon dioxide layer (c) with a thickness of approximately 0.5 nm over the silicon nitride layer. As shown in FIG. 2, $Si_{LVV}$ of the hydrogen-terminated silicon (a), silicon nitride (b) and silicon dioxide (c) were minus peaks at 91 eV, 84 eV and 79 eV, respectively.

Figure 3:
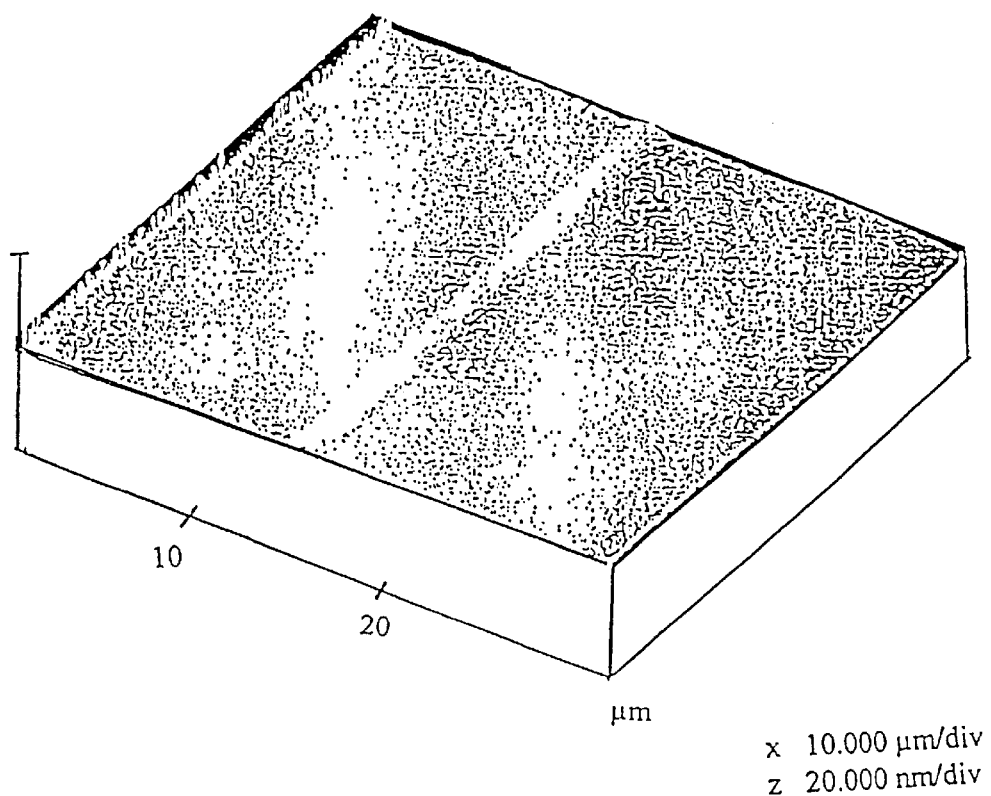
FIG. 3 is a photograph taken by an atomic force microscope (AFM), which shows the structure of silicon grown in a line selectively using the mask according to the preferred embodiment of the present invention.

FIG. 3 is a photograph taken by an atomic force microscope (AFM), which shows the structure of silicon grown in a line selectively using the mask according to the preferred embodiment of the present invention. The linear pattern shown in the photograph is the selectively grown silicon. Here, to selectively grow the silicon in such a linear form, a 25 eV electron beam was irradiated up to 100C/cm$^2$ to define a growth region by the electron beam generator 13 in the electron beam irradiating and testing chamber 12. The resulting substrate was moved through the carrying rod 11 into the selective growth chamber 7 to selectively grow silicon by thermal CVD. The reaction conditions were: 0.4 mTorr pressure of disilane, 580° C. substrate temperature, and a growth time of 50 seconds. As a result, the silicon was selectively grown in the electron beam irradiated region with a width of approximately 1 μm.

Figure 4:
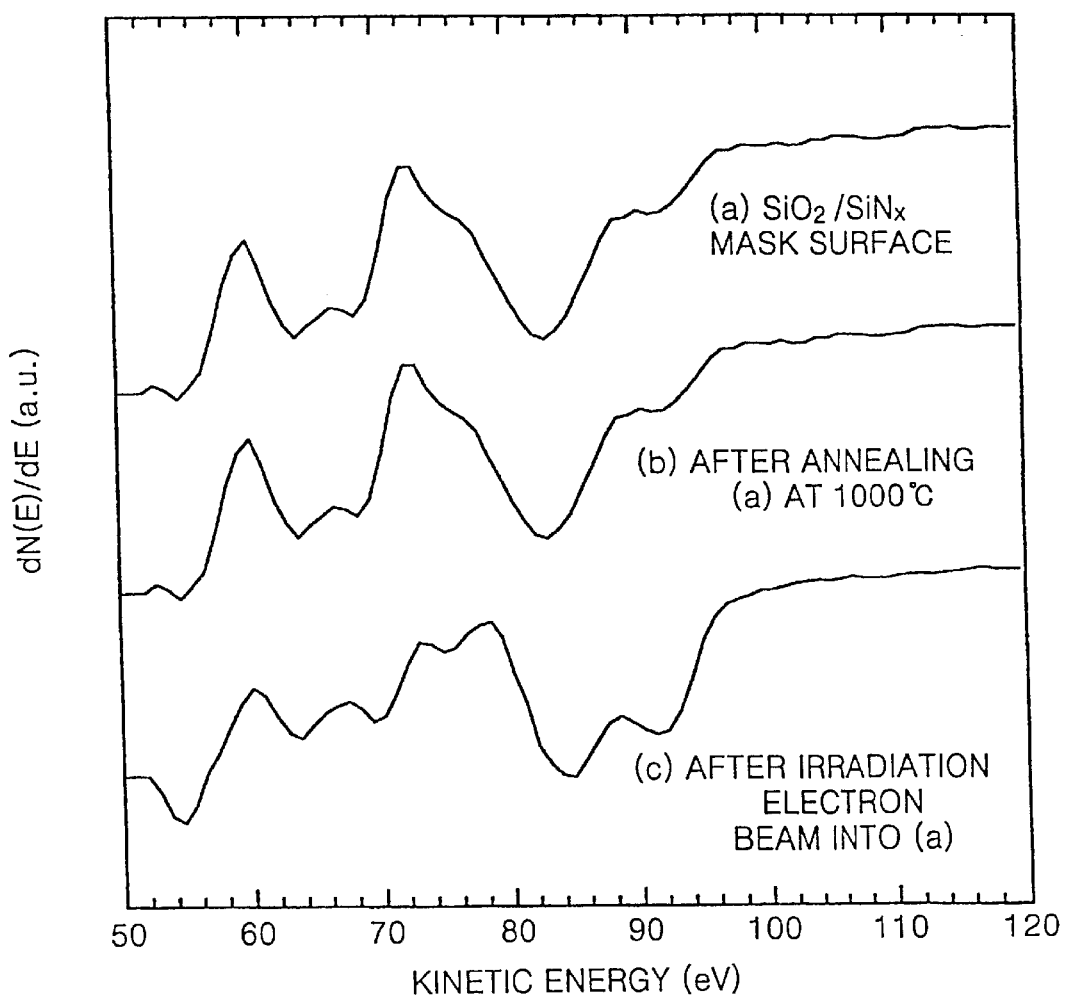
FIG. 4 shows the stability to heat and electron beams of the mask according to the preferred embodiment of the present invention.

FIG. 4 is a graph that shows the stability to heat and electron beams of the mask according to the preferred embodiment of the present invention. This graph shows LVV peaks of silicon ($Si_{LVV}$) by scanning the surface of the masks through Auger electro-spectroscopy in the electron beam irradiating and testing chamber 12. In FIG. 4, the line (a) represents the surface of the mask before annealing and line (b) represents the surface of the mask after annealing at 1000° C. for 30 seconds. Line (c) represents the surface of the mask onto which electron beams of 15 keV was irradiated up to 400C/cm$^2$.

It can be seen from lines (a) and (b) that there was no change in chemical composition after annealing at a high temperature. As can be seen from lines (a), (b), and (c), the peak of nitride silicon at 84 eV was not changed by the irradiation of electron beams. This means that the chemical composition of the silicon nitride layer is stable against an irradiation of electron beams. However, the change in the peak in line (c) near 92 eV is due to a reduction of silicon dioxide by the electron beams.

In the preferred embodiment the surface of the hydrogen-terminated silicon substrate is nitrified and oxidized to form the mask. However, the mask may be manufactured by another method. For example, the hydrogen-terminated silicon may be oxidized using plasma-excited oxygen at room temperature to form a silicon dioxide layer first on the surface of the silicon substrate. Then, the resulting structure, including the silicon dioxide layer on the silicon substrate, can be exposed to plasma-excited nitrogen, to form a silicon nitride layer between the silicon substrate and the silicon dioxide layers.

Also, although in the preferred embodiment, a thermal CVD process is used for the selective growth, a plasma-enhanced CVD process may also be used for the same purpose.

A method for selectively growing silicon on a substrate using a mask manufactured according to the preferred embodiment of the present invention will be described below with reference to FIGS. 5 through 7.

Figure 5:
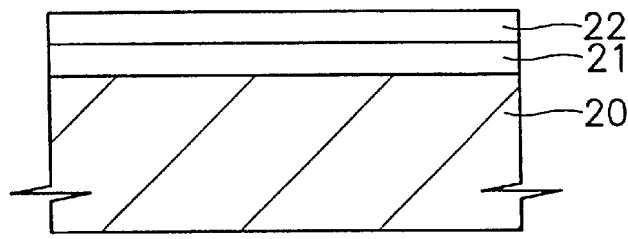
FIGS. 5 through 7 are sectional views illustrating a method for selectively growing a solid using the mask manufactured by the method according to the preferred embodiment of the present invention.

FIG. 5 is a sectional view of the mask for the selective growth of a solid manufactured according to the preferred embodiment of the present invention. In FIG. 5, the mask comprises a silicon nitride layer 21, or an underlayer formed over a silicon substrate 20 and a silicon dioxide layer 22, or a surface layer, formed over the silicon nitride layer 21. Preferably, the combined thickness of the silicon nitride layer 21 and the silicon dioxide layer 22 is 10 nanometers or less.

Figure 6A:
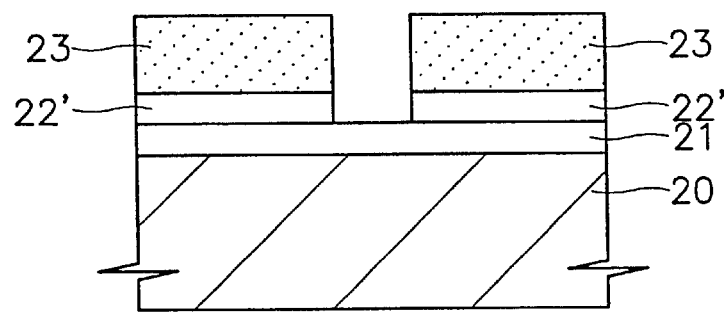

As shown in FIG. 6A, a growth region where a solid is to be selectively grown is defined in the surface layer of the mask, i.e., the silicon dioxide layer 22. To define the selective growth region of the solid in the silicon dioxide layer 22, a photoresist pattern 23 is formed over the silicon dioxide layer 22. The photoresist pattern 23 exposes a part of the silicon dioxide layer 22, in the place where the selective growth region is to be formed. The silicon dioxide layer 22 is then etched using the photoresist pattern 23 as an etching mask, defining the selective growth region shown in FIG. 6A. The photoresist pattern 23 is then removed by a known method.

In FIG. 6A, only a portion of the surface layer (i.e., the silicon dioxide layer 22) of the mask is removed to define a selective growth region and the silicon nitride layer 21 is left to be used as an insulator. However, depending on the need of the devices that require the resulting silicon pattern, the silicon nitride layer 21 may also be removed to define a selective growth region, exposing the substrate 20 as shown in FIG. 6B, and a solid may then be grown on this structure.

Figure 6B:
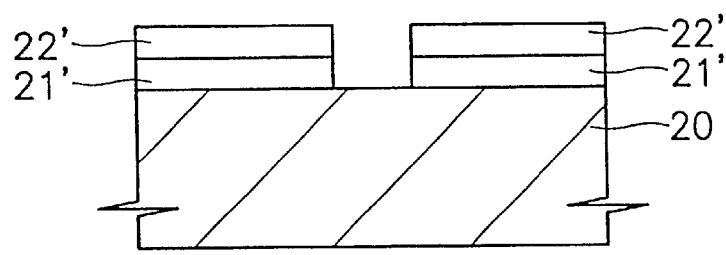
Figure 6C:
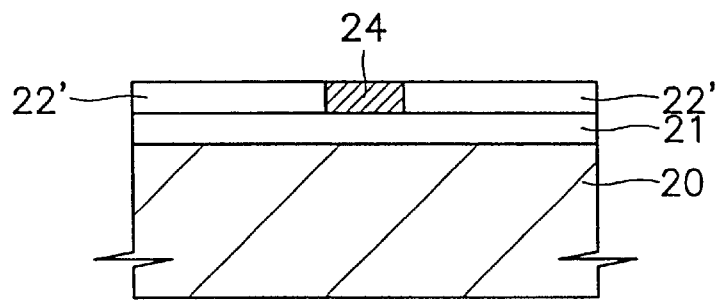

Alternatively, as shown in FIG. 6C, the selective growth region may be defined by irradiating electron beams onto a portion of the silicon dioxide layer 22. In other words, the electron beams may be irradiated onto only a part of the silicon dioxide layer 22, where a solid is to be selectively grown, to desorb oxygen from the silicon dioxide layer 22, and in this way form a selective growth region 24 of silicon. The method of using the electron beams to define a selective growth region as shown in FIG. 6C is preferable when silicon is selectively grown in the form of a fine pattern.

Figure 7A:
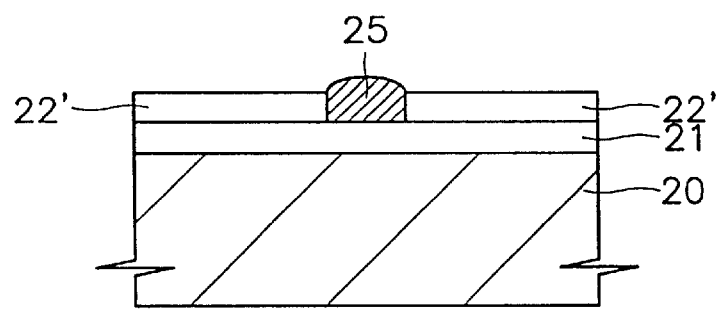
Figure 7B:
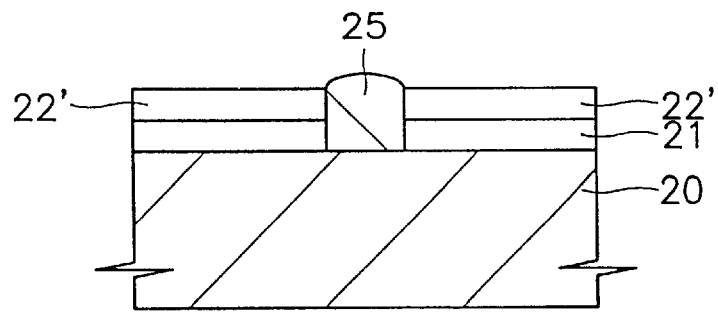

Silicon is then selectively grown in the selective growth region defined as shown in FIG. 6A, 6B or 6C, preferably by a thermal CVD or a plasma CVD process, resulting in a silicon pattern 25 as shown in FIG. 7A or 7B, which are selectively formed only on the selective growth region, not on the remaining silicon dioxide layer 22' that acts as the surface layer of the mask. The structure of FIG. 7A corresponds to the growth region resulting from the structure used in FIGS. 6A and 6C. The structure of FIG. 7B corresponds to a growth region resulting from the structure used in FIG. 6B.

In addition, the remaining silicon dioxide layer 22', i.e., the surface layer of the mask, may be removed to use the selectively grown silicon pattern 25 in devices that require such a fine conductive pattern, e.g., a photovoltaic cell, a light-emitting diode (LED), a single-electron transistor, a semiconductor laser, a thin film transistor (TFT), or the like.

In addition, although in the preferred embodiment silicon is used as the solid to be selectively grown, another metal such as tungsten (W), aluminum (Al), or a silicide compound may be selectively grown in the same manner described above.

As set forth above, a mask is provided according to a preferred embodiment of the present invention for the selective growth of a solid, and a method for manufacturing the mask is also provided. The mask is formed on the substrate in a dual-layered structure with a surface layer and an underlayer, which have different chemical compositions from each other. In other words, the surface layer of the mask is formed of a material with an optimal selectivity to the growth of the solid, while the underlayer is formed of a material that has a good adhesiveness to the surface of the substrate and enhances the stability of the entire mask. Thus, even though the mask is in the form of an ultra thin film, a good selectivity in growth of a solid can be maintained with a thermal stability, which is enough to suppress the generation of mask defects. In addition, the mask is stable to the irradiation of electron beams, so the effect of the electron beams is restricted to the surface layer. As a result, a fine pattern can be formed by irradiating with electron beams, without causing damage to the insulating property of the mask.

For example, consider the case of an ultra thin mask with a thickness of several nanometers or less, in which a silicon nitride layer is formed on a silicon substrate and a silicon dioxide layer is formed on the silicon nitride layer. Because the surface layer is formed of silicon dioxide, the mask has an equivalent selectivity in growth to a conventional mask formed of only silicon dioxide with a thickness of 10 nm or more. Also, because silicon nitride with a thermal stability is used for the underlayer, it is possible to subject the mask to annealing at 1000° C. or more regardless of the fact that it has a thin structure of several nanometers or less. In addition, due to the stability of silicon nitride to electron beams, the silicon nitride layer can be left to be used as an insulating layer for a device after the mask is patterned using electron beams. As above, the mask for the selective growth of a solid according to the present invention is stable in a selective growth at as fine a precision as on the nanometers.

What is claimed is:

1. A method for manufacturing a mask for selectively growing a solid over a growth region of a substrate and suppressing growth of the solid over other regions of the substrate, the method comprising:

forming an underlayer comprising silicon nitride over the substrate; and forming a surface layer comprising silicon dioxide over the underlayer;

wherein the combined thickness of the underlayer and the surface layer is 10 nanometers or less.

2. A method for manufacturing a mask for selectively growing a solid over a growth region of a substrate and suppressing growth of the solid over other regions of the substrate, the method comprising:

forming a surface layer comprising silicon dioxide over the substrate; and after forming the surface layer, nitrifying the substrate underneath the surface layer to form a silicon nitride layer underneath the surface layer.

3. A method for manufacturing a mask, as recited in claim 2, wherein the thickness of the surface layer is 10 nanometers or less.

4. A method for selective growth of a solid, comprising:
forming a mask over a substrate for the selective growth of the solid, the mask comprising an underlayer and surface layer, each of which has a different chemical composition;
defining selective growth region over the substrate, where the solid is to be grown; and
selectively growing the solid in the selective growth region;
wherein the combined thickness of the underlayer and the surface layer is 10 nanometers or less.

5. A method for selective growth of a solid, as recited in claim 4, wherein the underlayer comprises silicon nitride and the surface layer comprises silicon dioxide.

6. A method for selective growth of a solid, as recited in claim 5, wherein the solid to be grown comprises silicon.

7. A method for selective growth of a solid, comprising:
forming a mask over a substrate for the selective growth of the solid, the mask comprising an underlayer and surface layer, each of which has a different chemical composition;
defining selective growth region over the substrate, where the solid is to be grown; and
selectively growing the solid in the selective growth region,
wherein the defining of the selective growth region is carried out by irradiating electron beams onto a portion of the surface layer over the growth region.

8. A method for selective growth of a solid, as recited in claim 4, wherein the solid to be grown comprises one of tungsten (W), aluminum (Al), or a silicide compound.

9. A method for selective growth of a solid, as recited in claim 4, wherein the step of defining the selective growth region comprises:
forming a photoresist pattern that exposes the selective growth region over the surface layer, and
etching the surface layer using the photoresist pattern as an etching mask.

10. A method for selective growth of a solid, comprising:
forming a mask over a substrate for the selective growth of the solid, the mask comprising an underlayer and surface layer, each of which has a different chemical composition;
defining selective growth region over the substrate, where the solid is to be grown; and
selectively growing the solid in the selective growth region;
wherein the step of defining the selective growth region comprises forming a photoresist pattern that exposes the selective growth region over the surface layer, etching the surface layer using the photoresist pattern as an etching mask, and etching the exposed underlayer to expose the substrate, using the photoresist pattern as an etching mark.

11. A method for selective growth of a solid, comprising:
forming a mask over a substrate for the selective growth of the solid, the mask comprising an underlayer and surface layer, each of which has a different chemical composition;
defining selective growth region over the substrate, where the solid is to be grown; and
selectively growing the solid in the selective growth region;
wherein the step of defining the selective growth region comprises forming a photoresist pattern that exposes the selective growth region over the surface layer, etching the surface layer using the photoresist pattern as an etching mask, and etching the exposed underlayer to expose the substrate, using the etched surface layer as an etching mask.

12. A method for selective growth of a solid, as recited in claim 4, wherein the solid is grown by one of a thermal CVD or a plasma CVD process.

13. A method for selective growth of a solid, as recited in claim 7, wherein the combined thickness of the underlayer and the surface layer is 10 nanometers or less.

14. A method for selective growth of a solid, as recited in claim 10, wherein the combined thickness of the underlayer and the surface layer is 10 nanometers or less.

15. A method for selective growth of a solid, as recited in claim 11, wherein the combined thickness of the underlayer and the surface layer is 10 nanometers or less.

* * * * *